US005739480A

United States Patent [19]

Lin

[11] Patent Number: 5,739,480

[45] Date of Patent: Apr. 14, 1998

[54] SPEAKER BASE FOR ALTERNATIVELY MOUNTING DIFFERENT DRIVERS

[76] Inventor: Steff Lin, 2F., No. 35, Lane 466, Sec. 4, Ming Chih Rd., Tai San Hsiang, Taipei Hsien, Taiwan

[21] Appl. No.: 719,275

[22] Filed: Sep. 24, 1996

[51] Int. Cl.$^{6}$ .................................................... H05K 5/00

[52] U.S. Cl. .......................... 181/144; 181/155; 381/186; 381/160

[58] Field of Search .................................... 181/144, 152, 181/155, 163, 164, 165; 381/182, 184, 185, 186, 192, 90, 160

[56] References Cited

U.S. PATENT DOCUMENTS 4,811,406 3/1989 Kawachi .............................. 381/186
4,965,839 10/1990 Elieli .............................. 381/195
5,398,288 3/1995 Kizak .............................. 381/186
5,568,562 10/1996 Huang .............................. 381/186
5,602,930 2/1997 Walton .............................. 381/192
5,629,501 5/1997 Fenton .............................. 181/144

*Primary Examiner*—Khanh Dang
*Attorney, Agent, or Firm*—Bacon & Thomas

[57] ABSTRACT

Either a tweeter or a woofer diffuser may alternatively be detachably secured to a driver holder of a speaker base through axial engagement of lugs carried by the holder with guide grooves formed in a skirt of the driver and thereafter rotating the driver to dispose the lugs in a circumferential groove and out of alignment with the guide grooves.

5 Claims, 3 Drawing Sheets

SPEAKER BASE FOR ALTERNATIVELY MOUNTING DIFFERENT DRIVERS

BACKGROUND OF THE INVENTION

The present invention relates to speakers and relates more specifically to a speaker base which is adapted for use with either a tweeter or woofer diffuser.

Conventional speakers are designed for reproducing a specified sonic range. For example, a tweeter is designed to reproduce sounds of higher acoustic frequency, while a woofer is designed to reproduce sounds of lower acoustic frequency. Therefore, different speakers shall be used for different frequency requirements.

SUMMARY OF THE INVENTION

It is an object of the present invention to provide a speaker base which permits the user to detachably mount a tweeter or a woofer to form a speaker which can be used for both high acoustic frequency and low acoustic frequency. It is another object of the present invention to provide a speaker base which can alternatively be used with either a tweeter or a woofer diffuser. It is still another object of the present invention to provide a speaker base by which the user can assemble a tweeter and a woofer into a full range speaker system or separate the tweeter from the woofer and matching the woofer with a diffuser.

According to the present invention, a driver holder is provided and mounted on the bottom magnet holder plate of a speaker for holding a tweeter or a woofer diffuser. The holder comprises a base and a downward mounting holder rod which is fastened to the center through hole of the bottom magnet holder plate. A spring is provided on the inside center of the base for supporting the tweeter or woofer diffuser, and lugs are spaced around the periphery of the base for securing the tweeter or woofer diffuser to the base.

DETAILED DESCRIPTION OF THE PREFERRED EMBODIMENT

Figure 1:
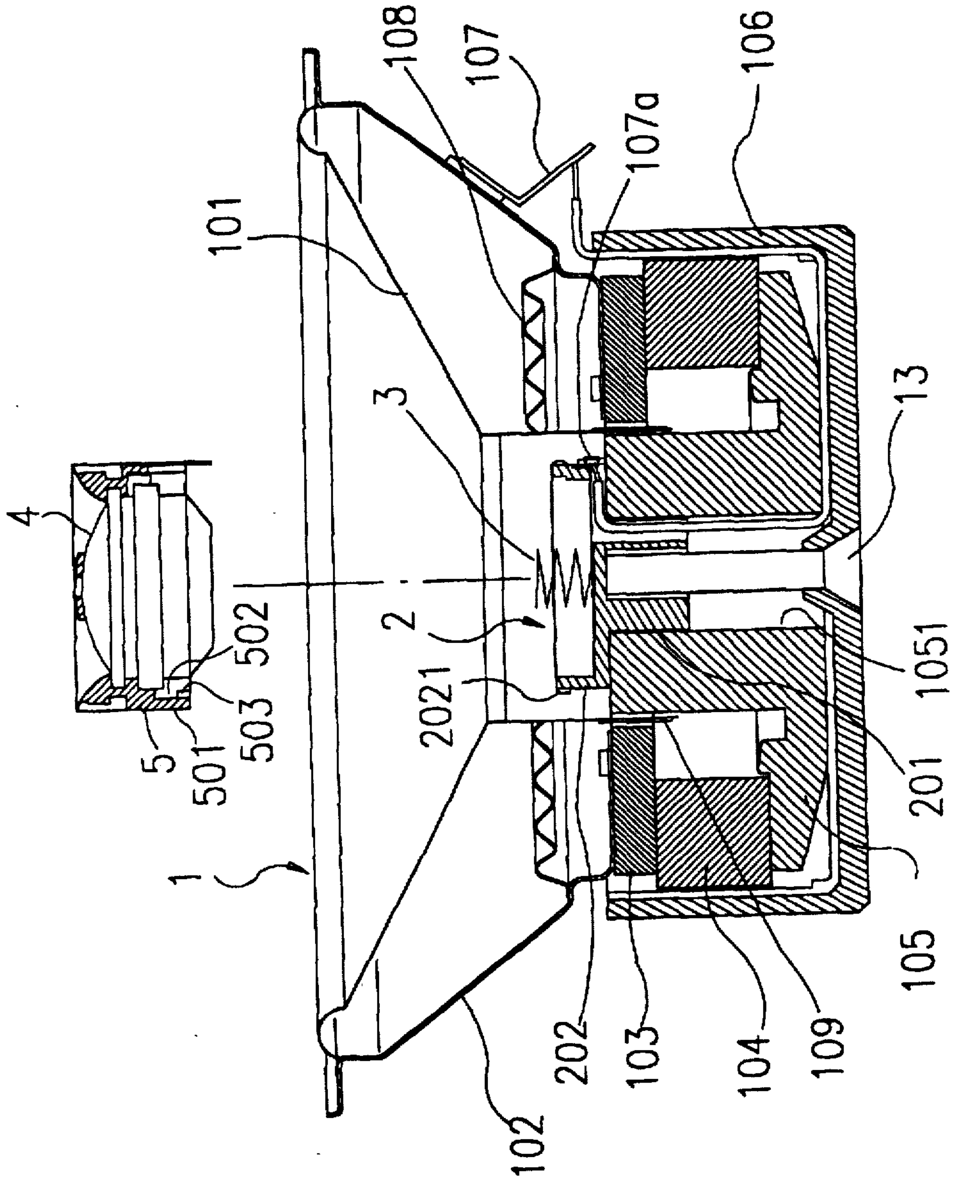
FIG. 1 is a sectional view of a speaker base and a tweeter according to the present invention.

Referring to FIG. 1, a speaker base 1 in accordance with the present invention is generally comprised of a paper cone 101, a frame 102, a top plate 103, a magnet 104, a bottom plate 105, a cover shell 106, a terminal 107, a spider 108, and a voice coil 109. These are similar to the basic components of a conventional speaker, therefore they will not be described further. According to the present invention, the center of paper cone 101 is a round opening (not a diaphragm), through which the top of the bottom plate 105 can be seen, the plate 105 having a center through hole 1051.

Figure 2:
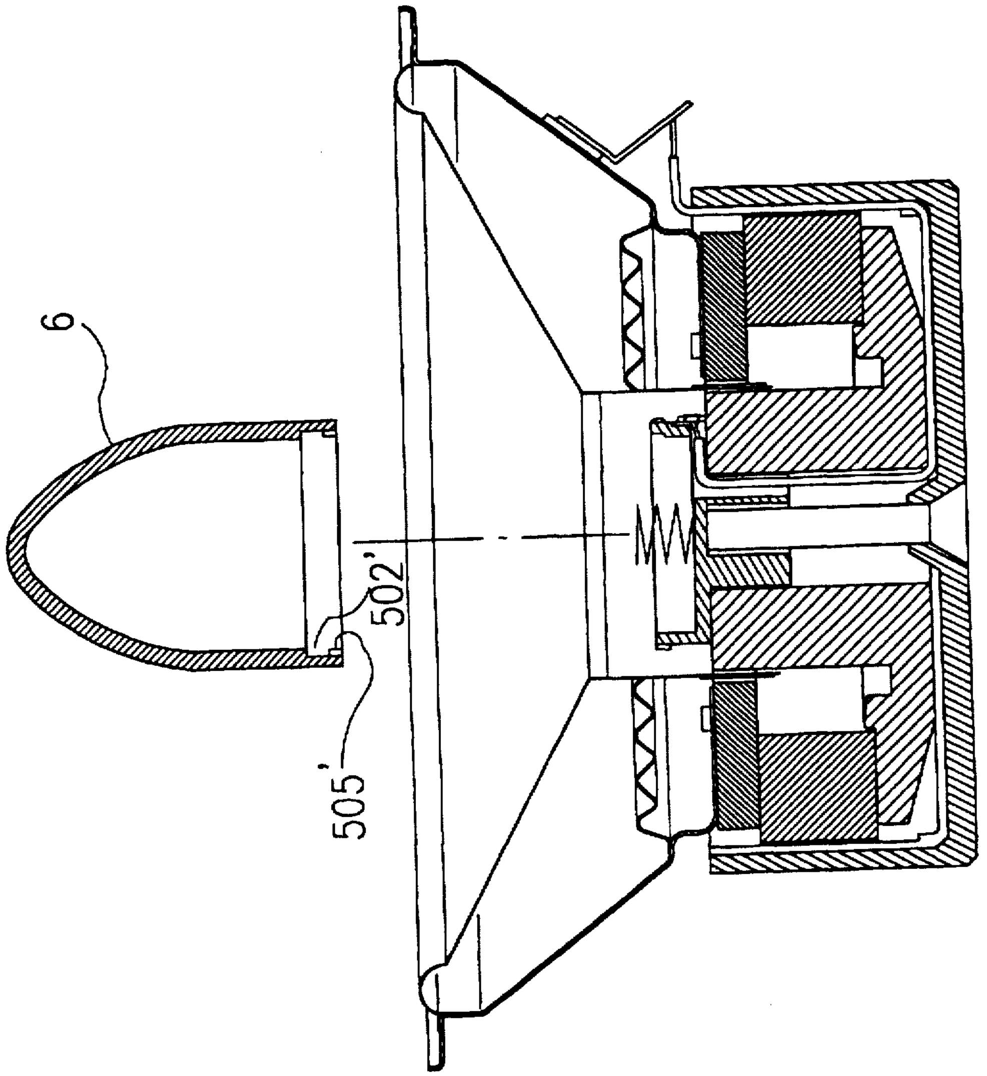
FIG. 2 is a sectional view of a speaker base and a woofer diffuser according to the present invention.

A driver holder 2 is mounted on the bottom plate 105, and is used for holding a tweeter 4 or a woofer diffuser 6 (see FIG. 2). The holder 2 comprises a base 202 supported on the top of the bottom plate 105, and a bottom holder rod 201 connected with the base 202 is plugged into the center through hole 1051 of the bottom plate 105 and secured to the bottom plate and cover shell 106 by a screw bolt 13 which threadedly engages rod 201. The base 202 is shaped like an upright rounded cup, and around its periphery are provided three lugs. A spring 3 is set on the inside center of the base 202. A terminal 107A is secured to the periphery of base 202 and is connected in parallel with terminal 107 by a conductor wire.

The tweeter 4 has a mounting ring frame 5 around its periphery for fastening to the tweeter holder 2. The mounting frame 5 comprises a bottom skirt 501 having a circumferential groove 502 around its inside wall and a plurality of guide grooves 503 extending perpendicularly from the groove 502 to the bottom edge of skirt 501.

Referring to FIG. 1, frame 5 around tweeter 4 may be molded in one piece with tweeter 4. As for the woofer diffuser 6 seen in FIG. 2, the circumferential groove 502' and guide grooves 505' are also designed in the same way as described above for tweeter 4, wherein a skirt is defined by the bottom portion of the woofer diffuser 6.

Figure 3:
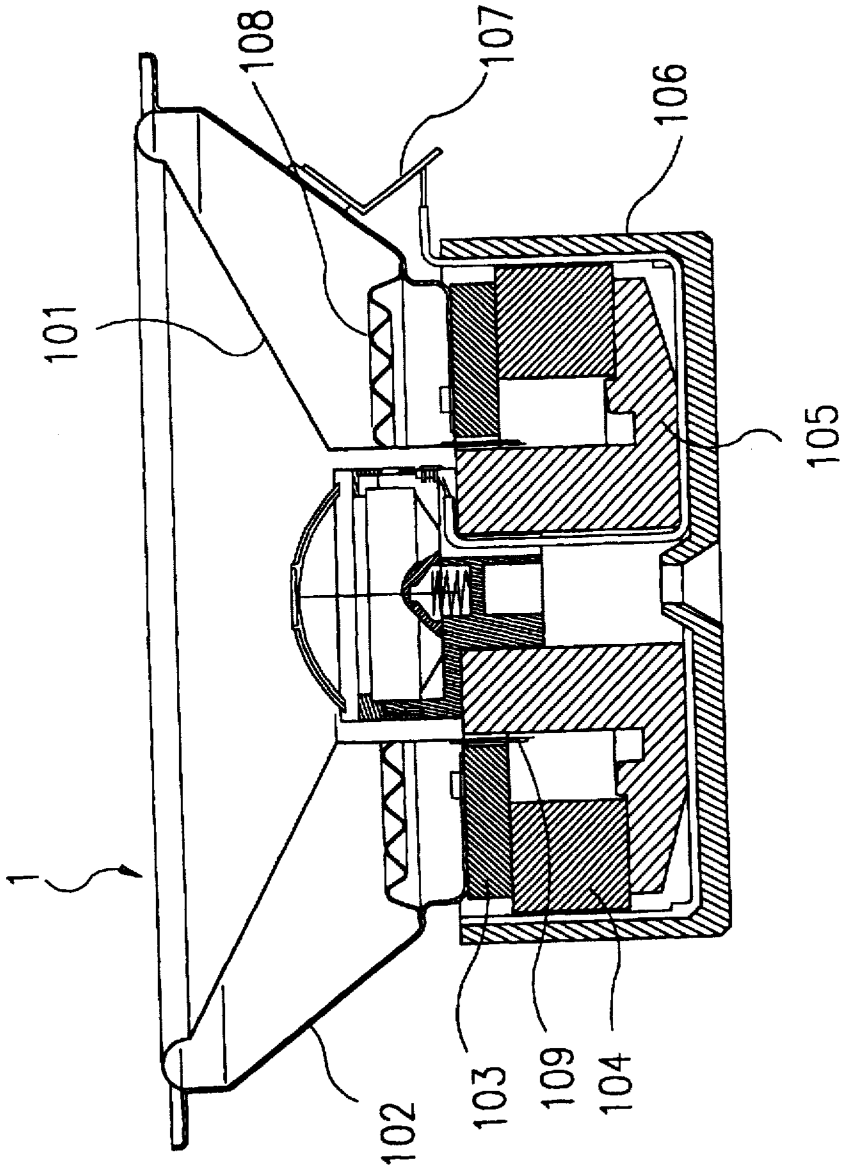
FIG. 3 is an assembly view of a FIG. 1.

Referring to FIGS. 1 and 3, the insulation of the tweeter or woofer diffuser 6 is simple and hereinafter outlined. For example, the tweeter 4 is inserted through the center opening of the cone 101 into the inside of the holder base 202 of the driver holder 2 to compress the spring 3. The lugs 2021 are respectively and axially forced through the guide grooves 503 into the circumferential groove 502, and then the tweeter 4 is rotated clockwise to separate the aligned lugs 2021 from guide grooves 503, thus securing the tweeter 4 into the holder base 202. When dismounting the tweeter 4, the latter is pressed down to compress the spring 3 and then rotated counterclockwise to align guide grooves 503 with the lugs 2021, thereby causing tweeter 4 to be raised by the power of the spring 3. The installing and removing procedure for the woofer diffuser 6 is essentially the same as described above.

What the invention claimed is:

1. A speaker base for alternatively mounting different drivers, the base comprising:
   - a) a paper cone having a central opening formed therein;
   - b) a bottom plate having a center through hole aligned with the central opening of the paper cone;
   - c) a driver holder mounted on the bottom plate, the holder including a base, a rod connected to the base and extending into the center through hole of the bottom plate, and means for securing the rod to the bottom plate;
   - d) a driver including a bottom skirt; and
   - e) cooperative engagement means carried by the driver and the driver holder for detachably securing the driver to the driver holder, which engagement means includes a plurality of lugs spaced around a periphery of the driver holder base and the bottom skirt of the driver having an inner circumferential groove and a plurality of guide grooves perpendicular to and extending downardly from the circumferential groove to a bottom edge of the skirt for engagement by the lugs.

2. The speaker base of claim 1 further including a spring member mounted inside the center of the driver holder base for compression by the driver.

3. The speaker base of claim 1 wherein the driver includes a tweeter, a ring extending around the periphery of the tweeter and the skirt being at the bottom of the ring.

4. The speaker base of claim 1 wherein the means for securing the rod to the bottom plate includes a screw bolt extending through the center through hole of the bottom plate and disposed in threaded engagement with the rod.

5. The speaker base of claim 1 wherein the driver is a woofer diffuser and the bottom skirt is disposed at a bottom portion of the diffuser.

* * * * *